United States Patent
Chiu

Patent Number: 6,019,844
Date of Patent: Feb. 1, 2000

[54] ACOUSTIC WAVE ENHANCED SPIN COATER

[75] Inventor: Wei-Kay Chiu, Hsin-Chu, Taiwan

[73] Assignee: Taiwan Semiconductor Manufacturing Company, Hsin-Chu, Taiwan

[21] Appl. No.: 09/196,753

[22] Filed: Nov. 20, 1998

Related U.S. Application Data

[62] Division of application No. 08/772,609, Dec. 23, 1996, Pat. No. 5,858,475.

[51] Int. Cl.$^7$ .................................................. B05C 13/00
[52] U.S. Cl. ................................ 118/52; 118/57; 118/500
[58] Field of Search ........................ 118/52, 57, 500; 427/240; 384/535, 536

[56] References Cited

U.S. PATENT DOCUMENTS

| | | | |
|---|---|---|---|
| 3,862,856 | 1/1975 | Shipman | 118/57 |
| 4,633,804 | 1/1987 | Arii | 118/57 |
| 5,099,781 | 3/1992 | Frank | 118/52 |
| 5,395,803 | 3/1995 | Adams | 437/229 |
| 5,454,871 | 10/1995 | Liaw et al. | 118/300 |
| 5,472,370 | 12/1995 | Malshe et al. | |
| 5,609,995 | 3/1997 | Akram et al. | |
| 5,803,970 | 9/1998 | Tateyama | 118/52 |

OTHER PUBLICATIONS

Julian R. Frederick, Ultrasonic Engineering, pp. 1–3, 1965.
Antony Barber, Handbook of Noise and Vibration Control–6th Edition, "Glossary of Terms", pp. 2–4, 1992.

Primary Examiner—Laura Edwards
Attorney, Agent, or Firm—George O. Saile; Stephen B. Ackerman

[57] ABSTRACT

A method and an apparatus are disclosed to improve the planarization of a coating upon a substrate, in particular to improve the planarization of a photoresist or spin-on-glass coating upon a semiconductor wafer. This is achieved by coupling an ultrasonic wave generator to either the chuck or the spindle of the chuck. Ultrasonic waves emanating from the ultrasonic generator are induced into the coating, vibrating it. The vibration causes coating material to fill in the valleys of the coating, thus planarizing the surface of the coating.

2 Claims, 2 Drawing Sheets

ACOUSTIC WAVE ENHANCED SPIN COATER

This is a division of U.S. patent application Ser. No. 08/1772,609, filing date Dec. 23, 1996, now U.S. Pat. No. 5,858,475, Acoustic Wave Enhanced Spin Coater, assigned to the same assignee as the present invention

BACKGROUND OF THE INVENTION

1. Field of the Invention

This invention relates to a process for reducing surface irregularities of a coating upon a substrate in general and more particularly to a process for reducing surface irregularities of a photoresist or spin-on-glass coating upon a semiconductor wafer.

2. Description of the Prior Art

When a photoresist or spin-on-glass coating is deposited on a substrate pattern the coating is not totally planar because the coating somewhat follows the underlying contours of the pattern.

Prior art regarding reduction of surface irregularities on photoresist are disclosed in U.S. Pat. No. 5,395,803 (Adams). In this patent, coverings such as resist-type materials are dispersed onto a substrate in a spiral pattern to produce a more uniform coating than possible up to now. A method of planarizing spin-on-glass is disclosed in U.S. Pat. No. 5,454,871 (Liaw et al.). Here, a first coating of a silicate spin-on-glass is applied, filling the valleys of the irregular structure of the conductor layer. A second coating is then applied and both layers are cured. A uniform spin-on-glass dielectric layer is claimed.

SUMMARY OF THE INVENTION

It is an object of the present invention to provide a method and an apparatus to improve the planarization of a coating upon a substrate, in particular to improve the planarization of photoresist or spin-on-glass coatings upon a semiconductor wafer.

These objects have been achieved by providing an ultrasonic generator and coupling its ultrasonic wave in-to the semiconductor wafer by way of the chuck upon which the semiconductor wafer rests. This ultrasonic wave creates vibrations in the photoresist or spin-on-glass coating, causing material to flow from the peaks to the valleys of the coating. A much more planar surface is thus produced.

DESCRIPTION OF THE PREFERRED EMBODIMENT

This invention improves the flatness of a coating, especially those photoresist or spin-on-glass coatings with a high topography, by causing an ultrasonic wave to vibrate this coating and have the coating flow from the peaks to the valleys.

Figure 1:
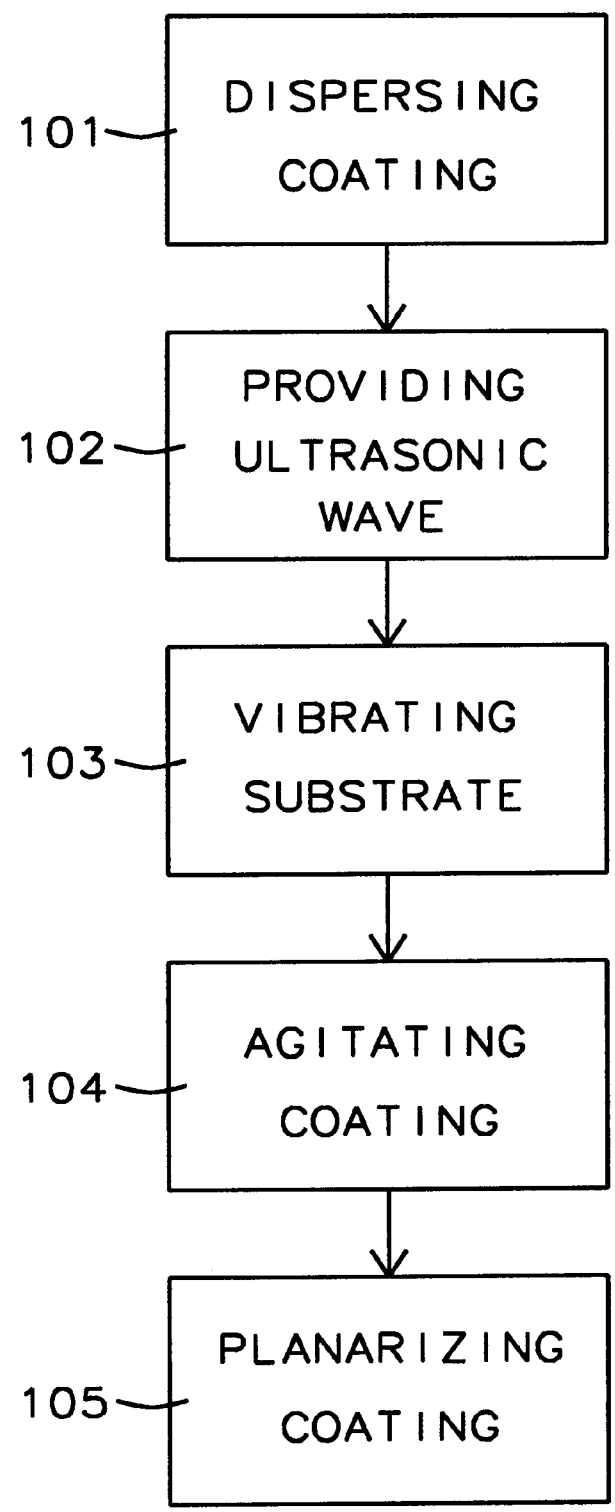
FIG. 1 is a block diagram illustrating the method of the present invention.

Referring now to FIG. 1, we show a block diagram of the method of the present invention. Block 101 shows the dispersing of a coating upon a substrate. This is done in a spin coater. The coating could be a photoresist coating or a spin-on-glass coating. In Block 102 an ultrasonic wave generator provides an ultrasonic wave, which couples, in Block 103, into the substrate and causes the substrate to vibrate. This vibration, in turn, agitates the coating, Block 104, increasing its mobility and causes the coating to flow better and become more planar, Block 105. Because of the agitation of the molecules in the coating, material flows from the higher sections of the coating to the lower sections, thereby making the surface smoother.

Figure 2:
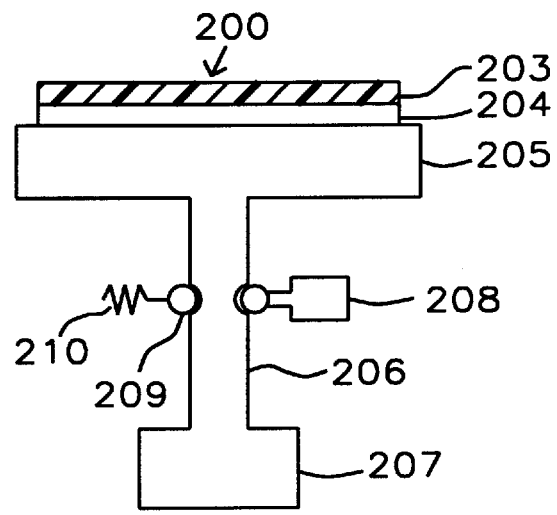
FIG. 2 is a side view of the ultrasonic generator, wafer, and chuck assembly, depicting one embodiment of the present invention.

Referring now to FIG. 2, an apparatus is disclosed which provides acoustic power to a spin coater 200 which will flatten the surface of a coating 203 on a substrate 204 through ultrasonic means. Chuck 205 supports substrate 204. Attached to chuck 205 is spindle 206. Spin motor 207 turns spindle 206, thereby rotating spin coater 200. In one embodiment of this invention an ultrasonic wave generator 208 couples to chuck 205 through appropriate means (not shown). In another embodiment of this invention the ultrasonic wave generator 208 attaches to ball bearing assembly 209. An ultrasonic wave emanating from the ultrasonic wave generator couples from the ball bearing assembly 209 into spindle 206. Ball bearing assembly 209, in turn, is supported by resilient means 210.

Figure 3A:
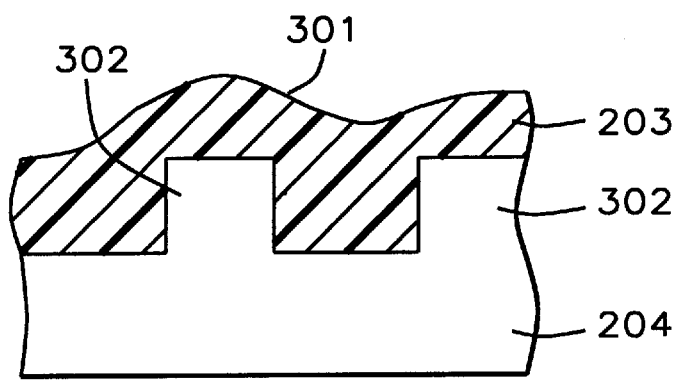
FIG. 3A is a detail of FIG. 2, showing a view of the photoresist or spin-or-glass coating and the pattern underneath, without the application of an ultrasonic wave.
Figure 3B:
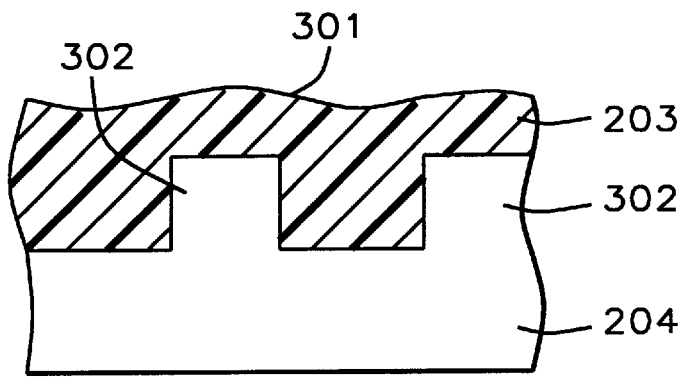
FIG. 3B is a detail of FIG. 2, showing a view of the photoresist or spin-on-glass coating and the pattern underneath, illustrating the effects of applying an ultrasonic wave as embodied in the present invention.

FIG. 3A is an enlargement of coating 203 and substrate 204 of FIG. 2, showing in detail how the surface 301 of the coating follows the pattern 302 of substrate 204 when the coating is not agitated. FIG. 3B is the same view, but now the coating is agitated, the valleys have been filled in, and the surface 301 is quite smooth.

Benefits of the ultrasonic method and apparatus are improved surface flatness at a modest cost in extra equipment.

While the invention has been particularly shown and described with reference to the preferred embodiments thereof, it will be understood by those skilled in the art that various changes in form and details may be made without departing from the spirit and scope of the invention.

What is claimed is:

1. An apparatus for providing acoustic power to a spin coater, comprising:

a chuck supporting a substrate;

a spindle attached to said chuck, a ball bearing assembly embedded in said spindle; an ultrasonic wave generator coupled directly into said ball bearing assembly, and a spin motor causing said spindle to rotate, thereby rotating said spin coater.

2. The apparatus of claim 1, wherein said ball bearing assembly is supported by resilient means.

* * * * *